(12) United States Patent
Ziesche et al.

(10) Patent No.: US 11,749,533 B2
(45) Date of Patent: Sep. 5, 2023

(54) METHOD OF MANUFACTURING A POWER SEMICONDUCTOR COMPONENT ARRANGEMENT OR A POWER SEMICONDUCTOR COMPONENT HOUSING

(71) Applicant: FRAUNHOFER-GESELLSCHAFT ZUR FÖRDERUNG DER ANGEWANDTEN FORSCHUNG E. V., Munich (DE)

(72) Inventors: Steffen Ziesche, Erlangen (DE); Christian Lenz, Erlangen (DE); Uwe Waltrich, Erlangen (DE); Christoph Bayer, Erlangen (DE); Hoang Linh Bach, Erlangen (DE); Andreas Schletz, Erlangen (DE)

(73) Assignee: Fraunhofer-Gesellschaft zur förderung der angewandten Forschung e.V., Munich (DE)

( * ) Notice: Subject to any disclaimer, the term of this patent is extended or adjusted under 35 U.S.C. 154(b) by 45 days.

(21) Appl. No.: 17/233,867

(22) Filed: Apr. 19, 2021

(65) Prior Publication Data
US 2021/0327724 A1    Oct. 21, 2021

(30) Foreign Application Priority Data
Apr. 21, 2020    (DE) .................... 10 2020 205 043.0

(51) Int. Cl.
*H01L 21/48* (2006.01)
*H01L 23/373* (2006.01)
(Continued)

(52) U.S. Cl.
CPC .......... *H01L 21/4807* (2013.01); *H01L 21/52* (2013.01); *H01L 23/367* (2013.01); *H01L 23/3731* (2013.01)

(58) Field of Classification Search
CPC ... H01L 21/324; H01L 21/4807; H01L 23/15; H01L 23/291; H01L 23/3731;
(Continued)

(56) References Cited

U.S. PATENT DOCUMENTS

| 4,800,459 A | * | 1/1989 | Takagi | ............. H01L 23/49822 |
| | | | | 361/321.2 |
| 4,931,906 A | * | 6/1990 | Reifel | .................. H05K 5/0095 |
| | | | | 257/E23.189 |

(Continued)

FOREIGN PATENT DOCUMENTS

| DE | 100 42 653 A1 | 3/2002 | |
| DE | 600 11 515 T2 | 6/2005 | |
| WO | WO-2009096326 A1 * | 8/2009 | ............. H05K 1/186 |

OTHER PUBLICATIONS

German Patent Office, Examination Report in German Patent Application No. 10 2020 205 043.0 (Dec. 14, 2020).

*Primary Examiner* — Eduardo A Rodela
(74) *Attorney, Agent, or Firm* — Leydig, Voit & Mayer, Ltd.

(57) ABSTRACT

Disclosed is a method of manufacturing a power semiconductor component arrangement or a power semiconductor component housing. The method involves a sintering process in which the plurality of layer-shaped unsintered ceramic substrates are converted into a sintered ceramic single layer or multilayer substrate or into a sintered ceramic single layer or multilayer interconnect device. Also disclosed is a power semiconductor component arrangement or a power semiconductor component housing that can be manufactured using the above method. Further disclosed are the uses of the power semiconductor component arrangement or the power semiconductor component housing.

15 Claims, 2 Drawing Sheets

(51) Int. Cl.
*H01L 23/367* (2006.01)
*H01L 21/52* (2006.01)

(58) Field of Classification Search
CPC ........... H01L 23/3735; H01L 2924/097; H01L 2924/09701; H01L 2924/16587; H01L 2924/16787; H01L 2924/17787; H01L 21/52; H01L 23/3107
See application file for complete search history.

(56) References Cited

U.S. PATENT DOCUMENTS

| | | | |
|---|---|---|---|
| 6,241,838 B1 * | 6/2001 | Sakamoto | H01L 23/5383 156/89.18 |
| 6,252,761 B1 * | 6/2001 | Branchevsky | H05K 1/162 361/306.3 |
| 6,350,334 B1 * | 2/2002 | Shigemi | H01L 21/4807 156/289 |
| 6,395,118 B1 * | 5/2002 | Sakamoto | C04B 35/111 156/289 |
| 6,455,378 B1 * | 9/2002 | Inagawa | H01L 29/7811 257/E29.136 |
| 6,503,645 B1 * | 1/2003 | Taira | H01L 23/15 257/E23.173 |
| 6,551,427 B2 | 4/2003 | Sakamoto et al. | |
| 2002/0026978 A1 * | 3/2002 | Harada | H05K 1/16 156/89.11 |
| 2002/0117743 A1 * | 8/2002 | Nakatani | H01L 23/5389 257/788 |
| 2002/0150743 A1 | 10/2002 | Sakamoto et al. | |
| 2004/0222433 A1 * | 11/2004 | Mazzochette | H01L 25/0753 257/E33.059 |
| 2005/0186407 A1 * | 8/2005 | Mori | B32B 18/00 428/210 |
| 2006/0234021 A1 | 10/2006 | Tanei et al. | |
| 2007/0190349 A1 * | 8/2007 | Ishida | H01R 13/03 428/570 |
| 2008/0054425 A1 * | 3/2008 | Malhan | H01L 24/01 257/E25.016 |
| 2009/0107616 A1 | 4/2009 | Lyoo et al. | |
| 2009/0218665 A1 * | 9/2009 | Yang | H01L 23/13 257/676 |
| 2013/0229777 A1 * | 9/2013 | Otremba | H01L 23/3121 29/841 |
| 2014/0138667 A1 * | 5/2014 | Hibino | H10K 50/841 257/40 |
| 2015/0380331 A1 * | 12/2015 | Inaba | H01L 25/18 257/693 |
| 2016/0157366 A1 * | 6/2016 | Niino | H05K 5/0213 361/820 |
| 2017/0338190 A1 * | 11/2017 | Fujino | H01L 23/051 |

* cited by examiner

METHOD OF MANUFACTURING A POWER SEMICONDUCTOR COMPONENT ARRANGEMENT OR A POWER SEMICONDUCTOR COMPONENT HOUSING

CROSS-REFERENCE TO A RELATED APPLICATION

This patent application claims priority to German Patent Application No. 10 2020 205 043.0, filed on Apr. 21, 2020, the disclosure of which is incorporated herein in its entirety for all purposes.

BACKGROUND OF THE INVENTION

The present invention relates to a method of manufacturing a power semiconductor component arrangement or a power semiconductor component housing. In the method an arrangement or a housing technology is provided that comprises at least one semiconductor component, at least one element for an electrical contacting of the at least one semiconductor component, and a plurality of layer-shaped unsintered ceramic substrates, wherein the plurality of layer-shaped unsintered ceramic substrates are arranged at least partially around the at least one semiconductor component and the at least one element for the electrical contacting of the at least one semiconductor component. The arrangement is subjected to a sintering process in which the plurality of layer-shaped unsintered ceramic substrates are converted into a sintered ceramic single layer or multilayer substrate or into a sintered ceramic single layer or multilayer interconnect device and simultaneously an electrical connection of the at least one semiconductor component to the at least one element for the electrical contacting of the at least one semiconductor component takes place and a mechanical connection of the at least one semiconductor component and of the at least one element for the electrical contacting of the at least one semiconductor component to the ceramic single layer or multilayer substrate or the ceramic single layer or multilayer interconnect device takes place. The present invention also further relates to a power semiconductor component arrangement or a power semiconductor component housing that can be manufactured using the method in accordance with the invention and to their use.

SiC components are predominantly used in power electronics for connecting high electrical currents (up to several 100 A) and high voltages (several kV) in drives and energy converters. SiC has advantages in comparison with silicon due to its greater bandgap: higher junction temperatures of the power semiconductor components ($T_j \geq 200°$ C.), higher power density, and higher switching speed and switching frequency with smaller switching losses. These central functional advantages are opposed by a disadvantage of costs of the semiconductors (per surface) that are approximately three times higher. This disadvantage should be at least compensated for a wide commercial use on the level of the system costs with all associated components.

The conventional structural design and connection technology provides for a soldering of the semiconductor to a metalized ceramic substrate; the electric contacting at the upper side takes place by means of wire bonding technology. The semiconductor can be molded with an organic material for encapsulation. More innovative approaches integrate the semiconductor in a polymer-based circuit board and thus reduce the lead inductances relevant to the switching losses. Independent of the type of semiconductor, the current structural design and connection technology (housing, molding compounds, and connector contacts) can only temporary be operated at temperatures of up to 175° C., permanently up to 125° C. The thermal limit is already reached at 150° C. in the higher voltage range>1.7 kV. In addition, the currently used housing materials have a poor thermal conductivity, a poor corrosion resistance, and a non-adapted thermal expansion. The latter is approximately an order of magnitude greater than the expansion of SiC and makes the use in the higher temperature range impossible.

Starting from this, it was the object of the present invention to provide a method by which a power semiconductor component arrangement or a power semiconductor component housing that is also operable at a high operating temperature and with a high switching voltage can be manufactured in a simple manner.

This object is achieved by the features of the invention described herein with respect to a method of manufacturing a power semiconductor component arrangement or a power semiconductor component housing and by the features of the invention described herein with respect to a power semiconductor component arrangement or power semiconductor component housing. The invention described herein further relates to the use of the power semiconductor component arrangement or power semiconductor component housing in accordance with the invention. Advantageous further developments are also described.

In accordance with the invention, a method of manufacturing a power semiconductor component arrangement or a power semiconductor component housing is provided in which a) an arrangement (or a housing technology) is provided that comprises at least one semiconductor component, at least one element for the electrical contacting of the at least one semiconductor component, and a plurality of layer-shaped unsintered ceramic substrates, wherein the plurality of layer-shaped unsintered ceramic substrates are arranged at least partially around the at least one semiconductor component and the at least one element for the electrical contacting of the at least one semiconductor component, and b) the arrangement is subjected to a sintering process in which the plurality of layer-shaped unsintered ceramic substrates are converted into a sintered ceramic single layer or multilayer substrate (or into a sintered ceramic single layer or multilayer interconnect device) and simultaneously an electrical connection of the at least one semiconductor component to the at least one element for the electrical contacting of the at least one semiconductor component takes place and a mechanical connection of the at least one semiconductor component and of the at least one element for the electrical contacting of the at least one semiconductor component to the ceramic single layer or multilayer substrate (or the ceramic single layer or multilayer interconnect device) takes place.

The at least one semiconductor component is preferably at least one power semiconductor component.

The ceramic single-layer or multilayer substrate (or the ceramic single-layer or multilayer interconnect device) can preferably be contacted toward the outside, e.g. for integration in a circuit or similar.

An arrangement is first provided in step a) of the method in accordance with the invention. The arrangement comprises at least one semiconductor component, at least one element for the electrical contacting of the at least one semiconductor component, and a plurality of layer-shaped unsintered ceramic substrates. The plurality of layer-shaped unsintered ceramic substrates in the arrangement provided are here at least partially arranged around the at least one semiconductor component and the at least one element for the electrical contacting of the at least one semiconductor component. The plurality of layer-shaped unsintered ceramic substrates are preferably completely arranged around the at least one semiconductor component and the at least one element for the electrical contacting of the at least one semiconductor component. The layer-shaped unsintered ceramic substrates can be ceramic green bodies. The at least one element for the electrical contacting of the at least one semiconductor component can also be a metal paste, for example. In addition, beside the semiconductor element metal films or ceramic materials, which already have a high thermal or electrical conductivity before the sintering process, can also be enclosed in the arrangement of the unsintered ceramic substrates.

The arrangement provided in step a) is subjected to a sintering process in step b). A sintering of the plurality of layer-shaped unsintered ceramic substrates into a sintered ceramic single-layer or multilayer substrate takes place in this sintering process, with the at least one semiconductor component and the at least one element for the electrical contacting of the at least one semiconductor component simultaneously being sintered into the ceramic single-layer or multilayer substrate. An electrical bonding of the at least one semiconductor component to the at least one element for the electrical contacting of the at least one semiconductor component and a mechanical bonding of the at least one semiconductor component and of the at least one element for the electrical contacting of the at least one semiconductor component to the ceramic single-layer or multilayer substrate takes place by the sintering process here. The sintering or converting of the unsintered ceramic substrates to the sintered ceramic single-layer or multilayer substrate, the electrical bonding of the at least one semiconductor component to the at least one element for the electrical contacting of the at least one semiconductor component and the mechanical bonding of the at least one semiconductor component and of the at least one element for the electrical contacting of the at least one semiconductor component to the ceramic single-layer or multilayer substrate thus take place simultaneously in one step during the sintering process.

By electrical bonding of the semiconductor component to the element for the electrical contacting it is preferably understood that the semiconductor component is connected to the element for the electrical contacting such that an electrically conductive connection is obtained between the semiconductor component and the element for the electrical contracting.

By mechanical bonding of the semiconductor component and of the element for the contacting to the ceramic single-layer or multilayer substrate it is preferably understood that the semiconductor component and the element for the contacting are connected to the ceramic single-layer or multilayer substrate such that a firm and permanent connection is obtained between the semiconductor component and the ceramic single-layer or multilayer substrate and between the element for the contacting and the ceramic single-layer or multilayer substrate in which the semiconductor component and the element for the contacting are respectively in direct contact with the ceramic single-layer or multilayer substrate or also contain small gaps in the plane (e.g. at points that are irrelevant for the electrical insulation). The semiconductor component and the element for the contacting to the ceramic single-layer or multilayer substrate can fuse, for example, or a connection with material continuity (or an integral connection or a substance-to-substance bond) can be produced between the semiconductor component and the ceramic single-layer or multilayer substrate and between the element for the contacting and the single-layer or multilayer substrate.

The ceramic single-layer or multilayer substrate serves the fixing and electrical insulation of the at least one semiconductor component and of the at least one element for the contacting of the at least one semiconductor component. Since a ceramic substrate is used for this purpose, the semiconductor component arrangement in accordance with the invention can also be operated at high temperatures of above 400° C. and simultaneously at a high switching voltage of up to 6.5 kV.

The method in accordance with the invention is particularly characterized in that the sintering of the layer-shaped unsintered ceramic substrates into the ceramic single-layer or multilayer substrate and the bonding of the elements to one another—i.e. the electrical connection of the semiconductor component to the element(s) for the electrical contacting of the semiconductor component and the mechanical bonding of the semiconductor component and of the element (s) for the electrical contacting of the semiconductor component to the ceramic single-layer or multilayer substrate— take place simultaneously in one step. A substantial simplification of the manufacturing method is hereby achieved in comparison with methods from the prior art where a sintering of the ceramic material takes place first, the semiconductor component, the elements for the contacting of the semiconductor component and further possible elements are only subsequently soldered to the ceramic substrate, and an encapsulation of the arrangement thus obtained then takes place afterwards. A considerably simpler, faster, and less expensive manufacture of a semiconductor component arrangement and a favorable hermetic housing suitable for high temperatures of semiconductor components are thus possible using the method in accordance with the invention.

A further reduction in the costs of the manufacturing method would be possible, for example, in that the chip surface is significantly reduced in size. For this purpose, the at least one semiconductor component preferably has a total surface of at most 25 mm×25 mm. Since smaller chip surfaces additionally require proportionally less control power, the control circuit simultaneously also becomes less expensive. Smaller chip surfaces furthermore likewise contribute to the reduction of the switching losses as a result of their smaller output capacitance.

Before and/or during step a) the at least one semiconductor component is preferably prepared by semiconductor processes in its electrical capability and metallic contacting for the purpose that it is not negatively influenced in functionality and the forming electrical bonding by temperatures in the range from 400° C. to 1500° C., preferably from 800° C. to 900° C. These adaptations in the manufacturing process, for example, comprise an omission of polymer insulation layers on the semiconductor surface, a preparation of a metallization of the semiconductor for the sintering process suitable for high temperatures and/or an adaptation of the doping or metallization so that the fully functional semiconductor component is obtained by the final ceramic cofiring.

A preferred variant of the method in accordance with the invention is characterized in that the arrangement has at least one insulation layer that is arranged on the at least one semiconductor component, wherein in the sintering process a mechanical bonding of the at least one semiconductor component and of the at least one element for the electrical contacting of the at least one semiconductor component to the ceramic single-layer or multilayer substrate takes place at least in part via the at least one insulation layer, and wherein the at least one insulation layer is preferably at least one insulation layer composed of glass. The at least one insulation layer can, for example, be connected to the ceramic single-layer or multilayer substrate with material continuity, form-locking or force-locking, preferably with material continuity, by the sintering process. It is preferred that the at least one insulation layer is only arranged on the upper side of the at least one semiconductor component, i.e. that no insulation layer is arranged on the side surfaces of the at least one semiconductor component.

A further preferred variant of the method in accordance with the invention is characterized in that the at least one semiconductor component is selected from the group consisting of SiC semiconductor components, GaN semiconductor components, diamond semiconductor components, GaO semiconductor components, AlN semiconductor components, SOI—Si semiconductor components, and combinations thereof.

The at least one semiconductor component is particularly preferably an SiC semiconductor component, in particular an SiC chip. SiC semiconductor components or SiC chips are particularly highly suitable for connecting high electrical currents (up to several 100 A) and high voltages (several kV), e.g. in drives and energy converters. SiC has advantages in comparison with silicon due to its greater bandgap: higher junction temperatures of the power semiconductor components ($T_j$200° C.), higher power density, and higher switching speed and switching frequency with smaller switching losses.

In a further preferred variant of the method in accordance with the invention, the layer-shaped unsintered ceramic substrates are selected from the group comprising layer shaped ULTCC substrates ("ultra-low temperature cofired ceramic" substrates), layer-shaped unsintered LTCC substrates ("low temperature cofired ceramic" substrates), layer-shaped unsintered HTCC substrates ("high temperature cofired ceramic" substrates), layer-shaped unsintered oxide ceramic substrates (e.g. $Al_2O_3$), layer-shaped unsintered nitride ceramic substrates (e.g. AlN), and combinations thereof.

The layer-shaped unsintered ceramic substrates are particularly preferably layer-shaped unsintered multilayer ceramic substrates.

A further variant of the method in accordance with the invention is characterized in that the layer-shaped unsintered ceramic substrates have no shrinkage or no lateral shrinkage or no shrinkage harmful to the arrangement or to the semiconductor during the sintering process. This can be achieved, for example, either by the use of ceramic materials having a shrinkage restriction inherent in the material (self-constrained sintering) or by an external influence, e.g. by lamination of non-shrinking sacrificial films or by uniaxial pressure loads (pressure-assisted sintering) during the sintering process.

A further preferred variant of the method in accordance with the invention is characterized in that the at least one element for the electrical contacting
 a) comprises at least one metal layer that is arranged on a surface of the at least one semiconductor component that preferably permits a high temperature sintering process, in particular at a temperature between 400° C. and 1500° C.; and/or
 b) comprises at least one element for the (electrical) interlayer connection or for the (electrical) through contacting (e.g. via) that is introduced into one or more bore passages of one or more of the layer-shaped unsintered ceramic substrates before or during step a); and/or
 c) comprises at least one (electrical) conductor path that is applied before or during step a) to the surface of one or more of the layer-shaped unsintered ceramic substrates.

The at least one semiconductor component can have at least one metal layer or metallization for the electrical contacting on a surface. The metal layer can also be present as a metal paste. A sintering of the at least one metal layer or metal paste preferably also takes place in the sintering process in step b). The metal paste can here be sintered into a metal layer or metallization. A cosintering of the ceramic material and of the metallization thus takes place in the sintering process in step b). The at least one metal layer or metallization can be a planar, low-inductive metallization.

A further preferred variant of the method in accordance with the invention is characterized in that the at least one element for the electrical contacting comprises or consists of a material that is selected from the group consisting of silver, silver alloys, gold, gold alloys, platinum, platinum alloys, tungsten, tungsten alloys, molybdenum, molybdenum alloys, copper, copper alloys, aluminum, aluminum alloys, ceramic materials, silicon carbide compounds, graphite, graphite compounds, titanium borides, zirconium borides, and mixtures thereof.

In a preferred variant of the method in accordance with the invention, the at least one semiconductor component is completely hermetically encapsulated by the sintered ceramic single-layer or multilayer substrate after the sintering process in step b). This is achieved by a corresponding arrangement of the layer-shaped unsintered ceramic substrates around the at least one semiconductor component. In this respect, the arrangement in step a) can, for example, be provided such that the plurality of layer-shaped unsintered ceramic substrates are completely arranged around the at least one semiconductor component. It can then be achieved by the sintering process in step b) that the at least one semiconductor component is completely hermetically encapsulated by the sintered ceramic single-layer or multilayer substrate. Since the at least one semiconductor component is completely hermetically encapsulated by the sintered ceramic single-layer or multilayer substrate, the at least one semiconductor component is protected very much better from external influences, whereby a reliable function over a long time period is achieved.

A further preferred variant of the method in accordance with the invention is characterized in that the arrangement provided in step a) is subjected to a thermal treatment in the sintering process in step b) at a temperature in the range from 400° C. to 1500° C., preferably at a temperature in the range from 800° C. to 900° C. A particularly fast and efficient sintering of the ceramic material and a particularly strong bonding of the semiconductor component and of the element(s) for the contacting of the semiconductor component to the ceramic material can be achieved within this temperature range.

In a further preferred variant of the method in accordance with the invention, the arrangement provided in step a) is fastened to at least one base substrate before or after the sintering process in step b). The base substrate is preferably selected from the group consisting of direct copper bonded substrates, active metal bonding substrates Si$_3$N$_4$ substrates, Al$_2$O$_3$ substrates and combinations thereof.

In accordance with a further preferred variant of the method in accordance with the invention, the arrangement provided in step a) is fastened, preferably soldered or welded, to the at least one base substrate by at least one silver sintering layer. Alternatively, the arrangement provided can also be pressed onto the base substrate (press fit) and can simultaneously be contacted electrically and thermally with a highly thermally conductive, electrically conductive layer (TIM).

A further preferred embodiment of the method in accordance with the invention is characterized in that the arrangement provided in step a) additionally comprises at least one further element that is selected from the group consisting of sensors, preferably temperature sensors, pressure sensors, flow sensors, gas sensors;

passive components, preferably resistors, capacitors, inductors;

monolithic components, gate drivers, and combinations thereof.

The further element can, for example, be discrete or in the form of a functional layer.

In a further preferred embodiment of the method in accordance with the invention, at least one of the layer-shaped unsintered ceramic substrates has an integrated cooling structure that preferably comprises thermal vias, cooling channels, heat pipes, and/or cosintering silver substrates. A plurality, particularly preferably all, of the layer-shaped unsintered ceramic substrates respectively have an integrated cooling structure that preferably comprises thermal vias, cooling channels, heat pipes, and/or cosintering silver substrates.

A reduction of inherent stresses can preferably be achieved by cutouts and/or dimples.

Additional SiC components can preferably be integrated in the arrangement to thus achieve an improvement in the cooling and/or a cooling at both sides.

The present invention moreover also relates to a semiconductor component arrangement that can be or is manufactured in accordance with the method in accordance with the invention.

The semiconductor component manufactured by the method in accordance with the invention preferably has a reliable function at a high operating temperature (T>400° C.), a simultaneous usability at a high switching voltage (>3.3 kV) by a hermetic ceramic packing, and electrical disruptive strength at high temperatures, reduced parasitic transition impedances (<5 nH), and an excellent long term stability also under demanding environmental conditions.

The present invention further relates to the use of the semiconductor component arrangement in accordance with the invention for switching electrical currents, preferably electrical currents greater than 100 A, and voltages, preferably voltages greater than 1 kV, in drives and/or energy converters.

BRIEF DESCRIPTION OF THE SEVERAL VIEWS OF THE DRAWING(S)

DETAILED DESCRIPTION OF THE INVENTION

The present invention will be explained in more detail with reference to the following Figures and examples without restricting the invention to the specifically shown parameters.

Figure 1:
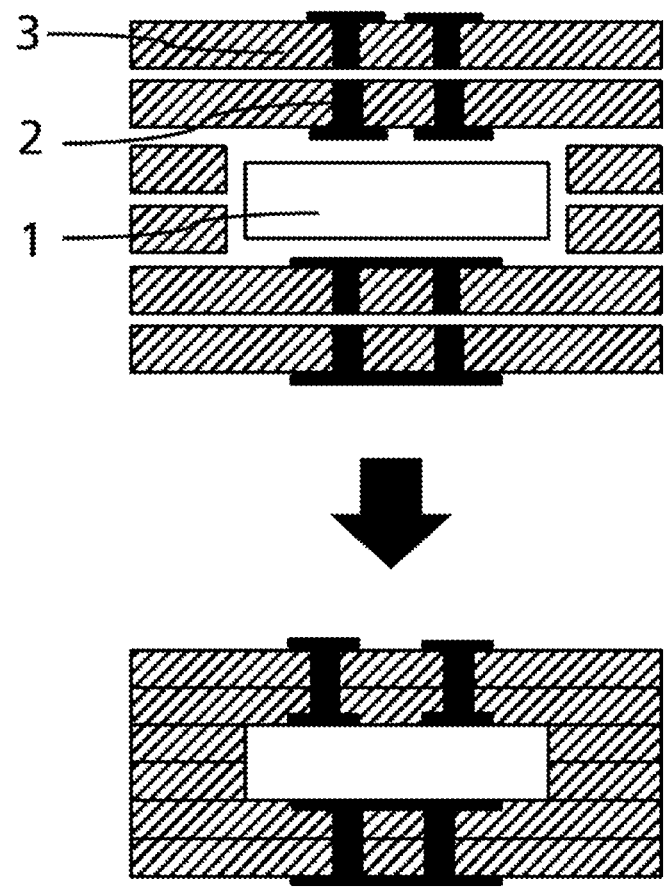
FIG. 1 illustrates the method in accordance with the invention.

The method in accordance with the invention is illustrated by way of example in FIG. 1. It is shown in the upper illustration how an arrangement is provided that comprises a semiconductor component 1 (e.g. Si power semiconductor component), a plurality of elements for the electrical contacting of the semiconductor component, and a plurality of layer-shaped unsintered ceramic substrates 3 (e.g. LTCC substrates). The elements for the electrical contacting of the semiconductor component comprise vias 2 by electrically highly conductive material, e.g. Ag, that were introduced in a plurality of bores of a plurality of the layer-shaped unsintered ceramic substrates 3. Alternatively, the elements for the electrical contacting of the semiconductor component comprise both metallization layers that are suitable for the process and for high temperatures and that are arranged on the surface of the semiconductor component and vias 2 by electrically highly conductive material, e.g. Ag, that were introduced in a plurality of bores of a plurality of the layer-shaped unsintered ceramic substrates 3.

The arrangement of the upper illustration is shown in the lower illustration of FIG. 1 after it has been subjected to a sintering process in which the plurality of layer-shaped unsintered ceramic substrates 3 had been converted into a sintered ceramic multilayer substrate or a sintered ceramic multilayer interconnect device, and simultaneously an electrical bonding of the semiconductor component 1 to the elements for the electrical contacting of the semiconductor component 1 and a mechanical bonding of the semiconductor component 1 and the elements for the electrical contacting of the semiconductor component 1 to the ceramic multilayer substrate or the ceramic multilayer interconnect device have taken place. The lower illustration in FIG. 1 thus shows an exemplary power semiconductor component arrangement in accordance with the invention.

Figure 2:
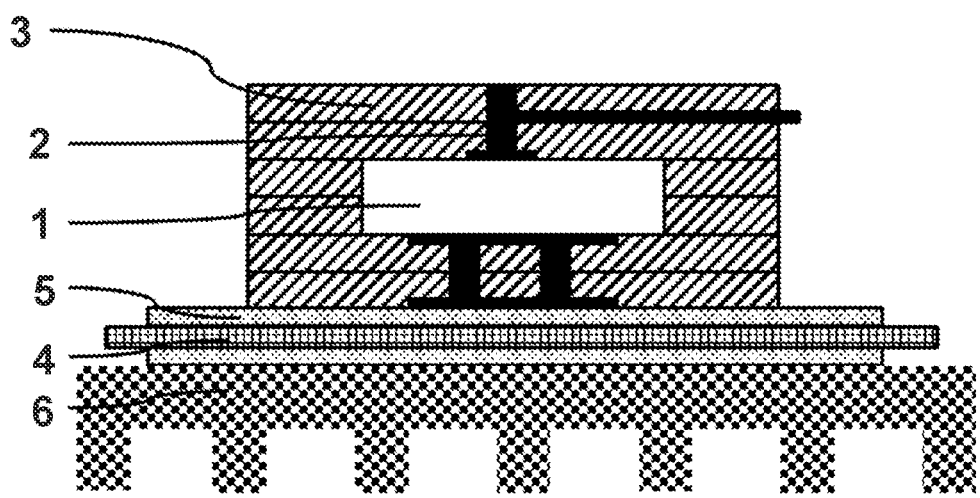
FIG. 2 shows two further exemplary power semiconductor component arrangements in accordance with the invention.
Figure 2:
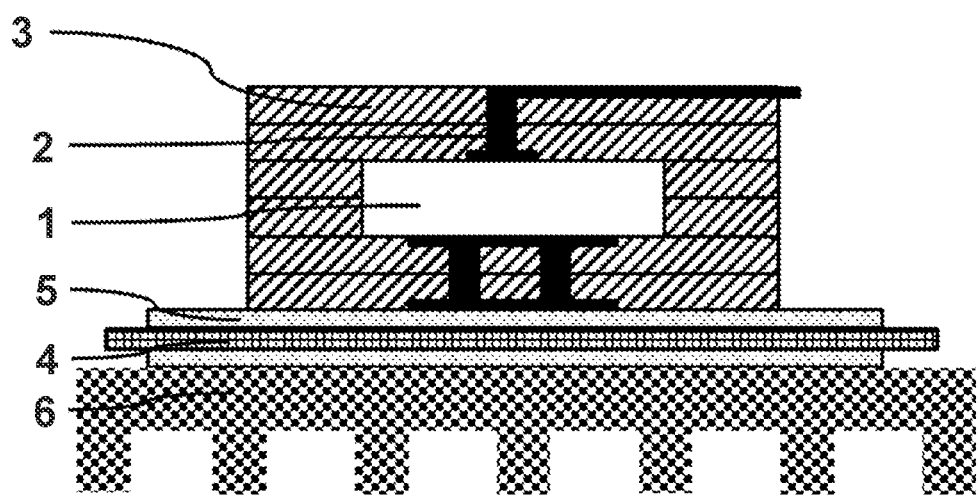

FIG. 2 shows two further exemplary power semiconductor component arrangements in accordance with the invention. They each comprise a semiconductor component 1 (e.g. an SiC power semiconductor component), a plurality of elements for the electrical contacting of the semiconductor component and a sintered ceramic multilayer substrate 3 (e.g. LTCC ceramic material) that was manufactured from layer-shaped unsintered ceramic substrates. The elements for the electrical contacting of the semiconductor component comprise vias 2 by electrically highly conductive material, e.g. Ag, that were introduced in a plurality of bores of a plurality of the layer-shaped unsintered ceramic substrates 3. Alternatively, the elements for the electrical contacting of the semiconductor component comprise both metallization layers that are suitable for the process and for high temperatures and that are arranged on the surface of the semiconductor component and vias 2 by electrically highly conductive material, e.g. Ag. Moreover, the elements for the electrical contacting of the semiconductor component also comprise one or more conductor paths that were applied to the surface of one or more of the layer-shaped unsintered ceramic substrates. The two semiconductor component arrangements shown in FIG. 2 are each fastened to a combination of two direct copper bonded substrates (DCB substrates), namely a DCB substrate 4 of an electrically highly conductive material, e.g. Cu, and a DCB substrate 5 of an electrically insulating material, e.g. $Si_3N_4$. The combination of DCB substrates is finally fastened to a cooling body 6.

The arrangements shown in FIG. 2 differ from one another by the location of the conductor paths. The arrangement shown at the top in FIG. 2 has a conductor path on the outer surface of the sintered ceramic multilayer substrate 3, whereas the arrangement shown at the bottom in FIG. 2 has a conductor path between two layers of the sintered ceramic multilayer substrate 3.

The present invention relates to a method of manufacturing a power semiconductor component arrangement or a power semiconductor component housing. An arrangement or a housing technology is provided in the method that comprises at least one semiconductor component, at least one element for an electrical contacting of the at least one semiconductor component, and a plurality of layer-shaped unsintered ceramic substrates, wherein the plurality of layer-shaped unsintered ceramic substrates are arranged at least partially around the at least one semiconductor component and the at least one element for the electrical contacting of the at least one semiconductor component. The arrangement is subjected to a sintering process in which the plurality of layer-shaped unsintered ceramic substrates are converted into a sintered ceramic single layer or multilayer substrate or into a sintered ceramic single layer or multilayer interconnect device and simultaneously an electrical connection of the at least one semiconductor component to the at least one element for the electrical contacting of the at least one semiconductor component takes place and a mechanical connection of the at least one semiconductor component and of the at least one element for the electrical contacting of the at least one semiconductor component to the ceramic single layer or multilayer substrate or the ceramic single layer or multilayer interconnect device takes place. The present invention also further relates to a power semiconductor component arrangement or a power semiconductor component housing that can be manufactured using the method in accordance with the invention and to their use.

The invention claimed is:

1. A method of manufacturing a power semiconductor component arrangement or a power semiconductor component housing, the method comprising:

providing an arrangement that comprises at least one semiconductor component, at least one element for an electrical contacting of the at least one semiconductor component, and a plurality of layer-shaped unsintered ceramic substrates, wherein the plurality of layer-shaped unsintered ceramic substrates are arranged at least partially around the at least one semiconductor component and the at least one element for the electrical contacting the at least one semiconductor component, and subjecting the arrangement to a sintering process in which the plurality of layer-shaped unsintered ceramic substrates are converted into a sintered ceramic single layer or multilayer substrate and simultaneously an electrical connection of the at least one semiconductor component to the at least one element for the electrical contacting of the at least one semiconductor component takes place and a mechanical connection of the at least one semiconductor component and of the at least one element for the electrical contacting of the at least one semiconductor component to the ceramic single layer or multilayer substrate takes place;

wherein the arrangement has at least one insulation layer that is arranged on the at least one semiconductor component, wherein during the sintering process, a mechanical bonding of the at least one semiconductor component and of the at least one element for the electrical contacting of the at least one semiconductor component to the ceramic single-layer or multilayer substrate takes place at least in part via the at least one insulation layer.

2. The method according to claim 1, wherein the at least one semiconductor component is selected from the group consisting of SiC semiconductor components, GaN semiconductor components, diamond semiconductor components, GaO semiconductor components, AlN semiconductor components, SOI—Si semiconductor components, and combinations thereof.

3. The method according to claim 1, wherein the layer-shaped unsintered ceramic substrates are selected from the group consisting of layer-shaped unsintered ULTCC substrates, layer-shaped unsintered LTCC substrates, layer-shaped unsintered HTCC substrates, layer-shaped unsintered oxide ceramic substrates, layer-shaped unsintered nitride ceramic substrates, and combinations thereof.

4. The method according to claim 1, wherein the layer-shaped unsintered ceramic substrates have no shrinkage or no lateral shrinkage or no shrinkage harmful to the arrangement or to the semiconductor during the sintering process.

5. The method according to claim 1, wherein the at least one element for the electrical contacting
comprises at least one metal layer that is arranged on a surface of the at least one semiconductor component; and/or
comprises at least one element for through-contacting that is introduced into one or more bore passages of one or more of the layer-shaped unsintered ceramic substrates before or during the step of providing the arrangement; and/or
comprises at least one conductor path that is applied before or during the step of providing the arrangement to the surface of one or more of the layer-shaped unsintered ceramic substrates.

6. The method according to claim 1, wherein the at least one element for the electrical contacting comprises a material selected from the group consisting of silver, silver alloys, gold, gold alloys, platinum, platinum alloys, tungsten, tungsten alloys, molybdenum, molybdenum alloys, copper, copper alloys, aluminum, aluminum alloys, ceramic materials, silicon carbide compounds, graphite, graphite compounds, titanium borides, zirconium borides, and mixtures thereof.

7. The method according to claim 1, wherein the at least one semiconductor component is completely hermetically encapsulated by the sintered ceramic single-layer or multilayer substrate after the sintering process in step b).

8. The method according to claim 1, wherein the arrangement provided in step a) is subjected to a thermal treatment in the sintering process in step b) at a temperature in the range from 400° C. to 1500° C.

9. The method according to claim 1, wherein the arrangement provided in step a) is fastened to at least one base substrate before or after the sintering process in step b).

10. The method according to claim 9, wherein the base substrate is selected from the group consisting of direct copper bonded substrates, active metal bonding substrates, $Si_3N_4$ substrates, $Al_2O_3$ substrates, and combinations thereof.

11. The method according to claim 9, wherein the arrangement provided in step a) is fastened to the at least one base substrate by at least one silver sintering layer.

12. The method according to claim 1, wherein the arrangement provided in step a) additionally comprises at least one further element selected from the group consisting of sensors, passive components, and combinations thereof.

13. The method according to claim 1, wherein the at least one of the layer-shaped unsintered ceramic substrates has an integrated cooling structure.

14. A power semiconductor component arrangement or a power semiconductor component housing produced by the method of claim 1.

15. A method of switching electrical currents in drives and/or energy converters comprising utilizing the power semiconductor component arrangement or the power semiconductor component housing according to claim 14.

* * * * *